United States Patent [19]

Steele et al.

[11] Patent Number: 4,777,433

[45] Date of Patent: Oct. 11, 1988

[54] SPECTRUM ANALYZER

[76] Inventors: Robert J. Steele, 28 Woodgreen Road, Waltham Abbey, Essex, England, EN9 3SD; John R. Grinham, 25 Anglesea Place, Clifton, Bristol, Avon, England, BS9 2WN

[21] Appl. No.: 67,019

[22] Filed: Jun. 26, 1987

[30] Foreign Application Priority Data

Jul. 2, 1986 [GB] United Kingdom ............... 8616111

[51] Int. Cl.$^4$ ............................................. G01R 23/16
[52] U.S. Cl. ................................. 324/77 K; 350/96.15
[58] Field of Search ............... 350/96.15, 96.16, 96.18, 350/96.20, 96.21, 96.30, 355, 374, 384, 385, 393; 332/7.51; 370/2; 324/77 K, 96

[56] References Cited

U.S. PATENT DOCUMENTS

| | | | |
|---|---|---|---|
| 4,166,212 | 8/1979 | Judeinstein | 250/199 |
| 4,480,192 | 10/1984 | Albrecht | 324/77 K |
| 4,633,170 | 12/1986 | Burns | 324/77 K |
| 4,647,767 | 3/1987 | Jubinski | 350/96.15 |
| 4,708,421 | 11/1987 | Desurvire | 350/96.15 |
| 4,719,412 | 1/1988 | d'Humieres | 324/77 K |

OTHER PUBLICATIONS

Ire Wescon Convention Record, Part 8, Aug. 18–21, 1959, pp. 56–66, San Francisco, U.S.; H. J. Bickel: "Spectrum Analysis with Delay-Line Filters".
Electronics Letters, vol. 13, No. 24, Nov. 1977, pp. 738–739, Hitchin, GB; J. S. Heeks et al.: "Spectrum Analysis with a C.C.D. Delay Line".
Electronics Letters, vol. 20, No. 12, Jun. 1984, pp. 486–487, Hitchin, GB; C. C. Wang et al.: "Fibre-Optic Recirculating Analogue Delay Line".
Ire Transactions on Instrumentation, vol. 1–10, No. 1, Jun. 1961, pp. 32–37, New York, U.S.; J. Capon: "High--Speed Fourier Analysis with Recirculating Delay-Line-Heterodyner Feedback Loops".
Patent Abstracts of Japan, vol. 7, No. 234 (P-230) [1379], Oct. 18, 1983; & JP-A-58 122 464 (Fujitsu K.K.) 21-07-1983.
Proceedings of the IEEE, vol. 64, No. 5, May 1976, pp. 805–807, New York, U.S.; K. Wilner et al.: "Fiber-Optic Delay Lines for Microwave Signal Processing".

*Primary Examiner*—Michael J. Tokar
*Attorney, Agent, or Firm*—Robert F. O'Connell

[57] ABSTRACT

A continuous wave laser and modulator drives a fibre optic delay line whose output is detected by a photo detector and gain control amplifier. The signal from the amplifier is phase advanced in a modulator by a phase advance signal whose period is equal to the loop delay including the delay line. The resulting signal is added to an input signal in an adder whose output is the modulating signal for the modulator. Cycles of the phase advanced signal are counted to establish a processing time of N circulations round the loop where N might be 160 or significantly larger. At the end of the processing time, the output signal from the adder, over a segment equal to the delay time, represents the frequency spectrum of the input signal. N can be varied to vary the resolution of the measurement. The fibre optic delay line provides a highly stable determinate delay and permits very wide band operation.

5 Claims, 2 Drawing Sheets

SPECTRUM ANALYZER

BACKGROUND OF THE INVENTION AND PRIOR ART

The present invention relates to a spectrum analyser. It is known to construct a spectrum analyser from a unity gain storage (delay line) loop with a phase shifter which advances the phase in the loop by means of a signal whose frequency is 1/T, where T is the delay time of the storage loop. See "Spectrum analysis with delayline filters". H. J. Bickel IRE Wessou Convention Record, pt. 8, pp. 59–67, 1959, and "High-speed Fourier Analysis with recirculating delayline-hererodyner feedback loops", J. Capon IRE Transaction on Instrumentation, pp. 32–37, June 1961.

These references describe the use of a bulk acoustic or surface acoustic wave delay line. Such acoustic delay devices suffer from a number of significant drawbacks. It is difficult to establish the desired delay line length reproducibly and changes to the delay line length are expensive and time consuming to implement. For example, in the case of a surface acoustic wave device, a new mask for the electrode structure has to be produced. These known devices also operate in a fixed frequency band and analysis of signals in other bands necessitates mixing to a fixed intermediate frequency. Acoustic delay devices are not particularly rugged and the wave velocity, and accordingly the effective delay line length, are highly temperature-dependent.

BRIEF DESCRIPTION OF THE INVENTION

One object of the present invention is to provide a spectrum analyser which does not suffer from these disadvantages but which is relatively inexpensive, and has very great design flexibility and broadband characteristics.

Another object of the invention is to provide a spectrum analyser which has variable frequency resolution.

The analyser according to the invention comprises a storage loop with a loop delay T. The delay is preferably provided by a fibre optic delay line because of such a lines stability and the ease with which the required delay time can be established, with high accuracy. The storage loop moreover comprises a modulator aud a detector which is responsive to the delay line output to provide a signal to the modulator. A source of a phase advance signal is connected to the modulator and an adder adds the output of the modulator to an input signal to be analysed. A continuous wave laser source is responsive to the output of the adder to generate the input to the fibre optic delay line. The loop gain of the storage loop is stabilised close to unity. Control means are provided for determining a processing time NT equal to a predetermined number N of circulations round the loop. This processing time is followed by a measurement time of duration T. The control means may be adjustable to select the value of N. The frequency resolution of the analyser is given by 1/NT and therefore improves with increasing N.

The invention will be described in more detail, by way of example, with reference to the accompanying drawings, in which:

FIG. 1 is a block diagram of the analogue circuits of an embodiment of the invention, FIG. 2 is a block diagram of the digital circuits, and FIG. 3 is an explanatory diagram.

DETAILED DESCRIPTION OF PREFERRED EMBODIMENT

Figure 1:
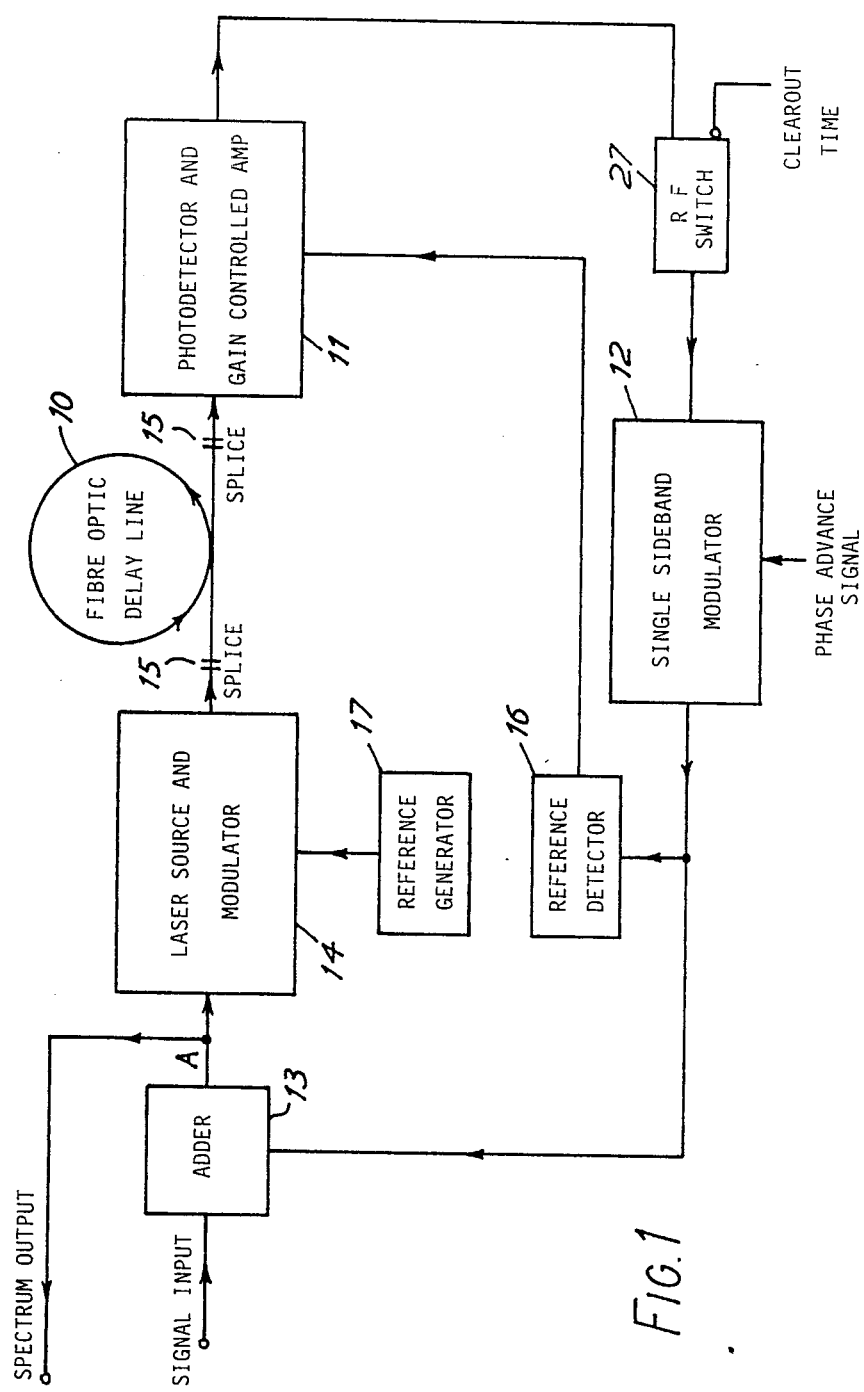

The illustrated spectrum analyser comprises a fibre optic delay line 10 which may provide a delay time of around 2us. The delay line is connected into a closed storage loop by way of the following items, in order from the output of the delay line:

Photodetector and gain controlled amplifier 11 establishing a loop gain very close to unity.

Single sideband modulator 12 to which a phase advance signal is applied.

Adder 13 which adds the input signal into the loop.

Laser source and modulator 14 which provides the input to the delay line 10 in response to the output from the adder.

The adder 13 is preferably a passive device selected to match the input frequency and amplitude range of the signal to be analysed. Two ports are combined with equal weighting to provide one output.

The output from the adder is used to modulate the continuous wave laser source 14. The laser wavelength is chosen to match the spectral characteristics of the optical fibre and the photodetector 11. The laser is preferably attached to the fibre delay line by a "pigtail" which is fusion spliced to the main delay line and the photodetector "pigtail" at splices 15.

The fibre for the delay line 10 is selected from a range of available fibres to suit the desired operating band. It is easy to cut the length of the fibre, by trial and error if need be, to precisely the desired delay length. This must be slightly less than the desired loop delay T to allow for the additional small delays in the rest of the loop.

The type of photodetector 11 is selected to match the spectral characteristics of the laser, fibre and the frequency response required of the overall fibre optic delay line loop. The resultant photocurrent is amplified up to provide a loop gain of slightly less than unity. The loop gain is controllled by the magnitude of a detected reference signal, as described below.

The amplified photocurrent is single sideband modulated by the phase advanced signal in the modulator 12 to produce either the upper or the lower sideband. The output of the single sideband modulator is applied to the adder 13 and a reference detector circuit 16.

The loop gain has to be stabilized very close to unity; how close depends upon the number N of recirculations to be employed in making a measurement. For a high value of N such as 2000, the loop gain needs to be 0.9995. Normally a value of N=200 or somewhat less will suffice and a loop gain of 0.994 is then good enough. In any event, the gain is stabilized by injecting a signal from a reference generator 17 at a frequency out of the processor bandwidth N/T. The reference signal passes through the laser modulator, fibre optic delay line, detector and amplifier and modulator stages to the reference detector 16. The level of the reference signal at this detector controls the gain of the amplifier 11. The reference signal can be a sinusoid with extraction at the detector 12 by narrowband filtering, e.g. using a crystal filter. The gain control signal can be derived from the extracted signal by precision rectification.

The only restriction on the input signal applied to the adder 13 is that its spectrum be confined to a bandwidth no greater than the reciprocal of the fibre optic loop storage time T. Improved sidelobe performance may be achieved by weighting the input signal with an appropriate mathematical function. As an equivalent to time domain weighting of the input it is possible to shape the frequency response of the delay line or of the output.

A segment of the signal taken from Point A in FIG. 1 at the output of the adder 13, equal to the fibre optic storage loop time T, approximates the magnitude and phase spectrum of the input signal. This is given by the amplitude and phase modulation on a carrier of centre frequency given, for a sinusoidal input, by:

$$E_{out}(N,\tau) = \qquad (1)$$

$$E \frac{\sin\frac{N+1}{2}(\omega T - \omega \alpha \tau)}{\sin\frac{1}{2}(\omega T - \omega \alpha \tau)} \cos\left\{\left(\omega + \frac{N}{2}\omega\alpha\right)\tau + \frac{N}{2}\omega T + \alpha\right\}$$

Where
 T = storage loop delay time
 E = peak input amplitude
 N = No. of circulations round loop
  = radian frequency of input signal
  = radian frequency of phase advance signal
  = variable between O and T
  = arbitrary phase angle The frequency resolution of the analyser is given by 1/NT and improves with the number of recirculations N.

The phase advance signal is a high stability sinusoidal signal preferably derived from a temperature compensated crystal controlled oscillator. The frequency of the oscillator is nominally (1/T)Hz, where T is the storage loop time.

The way in which the analyser operates is as follows. The input centre frequeucy is selected from some value from DC to a sufficiently high frequency depending upon how the input signal is to interface with the analyser. This then determines the choice of the fibre optic delay line components i.e. laser, fibre and photodetector. The centre frequeucy may be as high as 15 GHz.

The signal to be analysed is applied to the fibre optic storage loop via the passive adder 13 and laser modulator 14. The resultant optical signal is delayed by propagation down the optical fibre 10 by a time of slightly less than T seconds. Propagation time through other circuit elements is taken into account, such that an overall delay time of T seconds is achieved by the loop.

Figure 3:
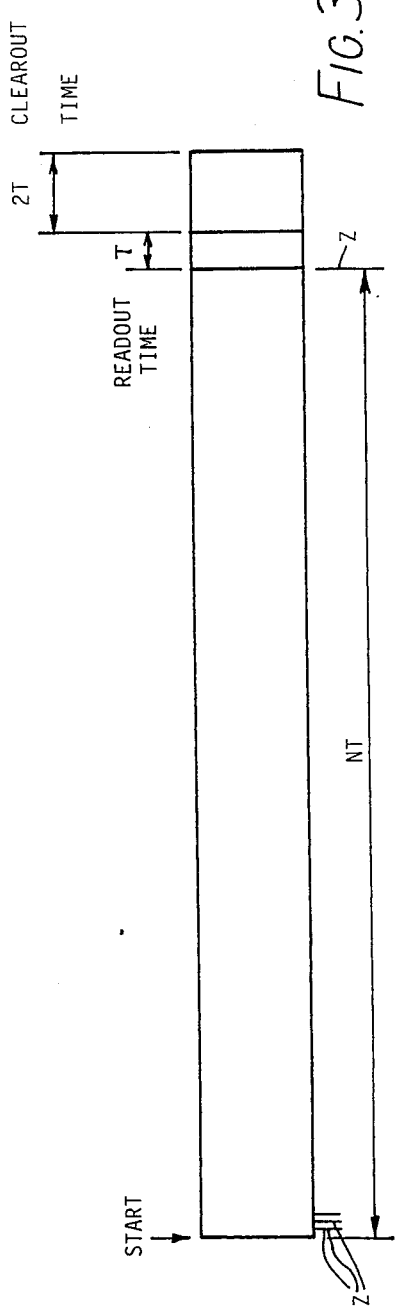

The optical signal is detected and the resultant photocurrent is amplified and then frequency advanced by a factor (1/T)Hz by the single sideband modulator 12. The output from the single sideband modulator is then fed back to the input where it is vectorially added to the input signal. The resultant sum then circulates/adds in the loop for a total of N−1 circulations. The frequency resolution of the analyser for a total processing time of Tp=NT is 1/T$_p$ Hz. The Fourier transform and phase spectrum of the input signal are obtained by reading out the contents of the delay line after time Tp. (FIG. 3). The output consists of a carrier with amplitude and phase modulation. The envelope of the carrier corresponds to a close approximation to the magnitude of the Fourier transform of the input spectrum, and the phase modulation is a close approximation to the input phase spectrum.

The output can be sampled by conventional single or multiple channel analogue to digital techniques to provide an interface to a digital signal processing system, or alternatively the resultant signal can be displayed in a panoramic display.

The limiting factor for N is determined by the bandwidth of the SSB modulator and the gain/phase characteristics of the loop.

Figure 2:
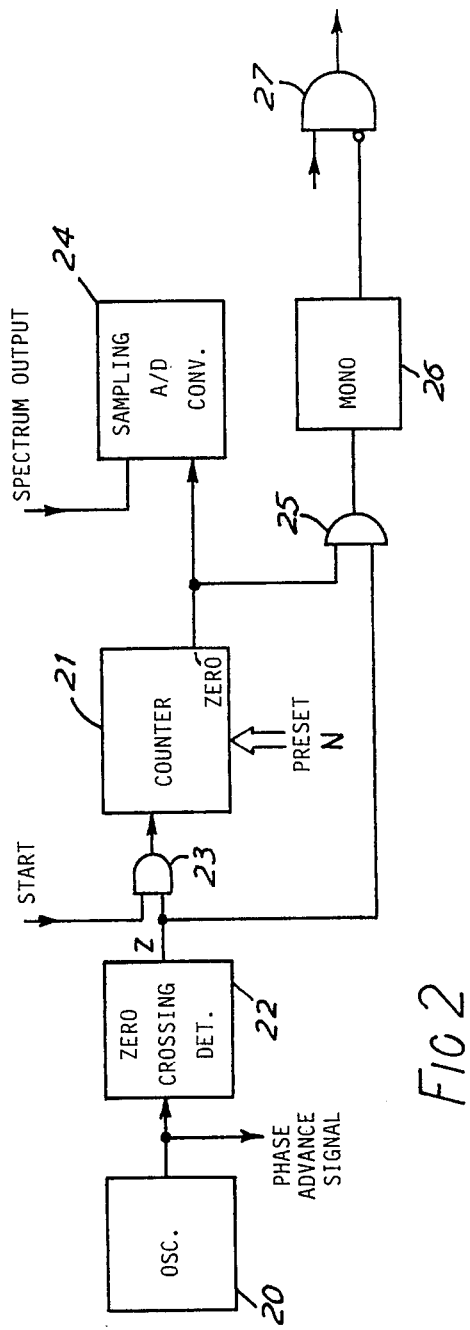

FIG. 2 shows the digital circuits of the analyser, operating in conjunction with the oscillator 20 which provides the phase advance signal. A counter 21 is provided with means for presetting the value of N to any value up to a predetermined limit. The signal from the oscillator 20 is applied to a zero-crossing detector 22 which produces one pulse every cycle of the phase advance signal. The pulses from the detector 22 count down the counter 21, commencing from the time of a START signal which may be generated manually or automatically but is in any event re-timed to coincide with a zero crossing pulse Z (FIG. 3) and enables a gate 23. When the counter has counted N pulses Z and reaches zero, it enables whatever readout device 24 is connected to the point A in FIG. 1, illustrated as a sampling analog to digital coverter in FIG. 2. The next pulse Z passes through a gate 25 and sets a monostable circuit 26 which times the clearout time (FIG. 3) and disables an RF switch 27 during this time. The RF switch 27 is included at any convenient point in the loop of FIG. 1 and acts as a switch holding the loop open for the clearout time to ensure that the loop is completely empty before the next processing cycle begins. The START signal may be given automatically at the end of the clearout time for continuous operation.

We claim:

1. A spectrum analyser comprising a storage loop with a loop delay T and including a fibre optic delay line, a modulator, a detector responsive to the delay line output to provide a signal to the modulator, a source of a phase advance signal connected to the modulator, an adder which adds the output of the modulator to an input signal, and a continuous wave laser source responsive to the output of the adder to generate the input to the fibre optic delay line, means for stabilizing the gain round the loop close to unity, and control means for determining a processing time NT equal to a predetermined number N of circulations round the loop, and a subsequent measurement time of duration T.

2. A spectrum analyser according to claim 1, wherein the control means is adjustable to select the number N.

3. A spectrum analyser according to claim 1, wherein the control means automatically enable readout of a spectrum output signal at the end of the processing time, during the measurement time and then interrupt the storage loop for sufficient time to clear the loop.

4. A spectrum analyser comprising a storage loop with a loop delay T and including a delay line, a modulator, a detector responsive to the delay line output to provide a signal to the modulator, a source of a phase advance signal connected to the modulator, an adder which adds the output of the modulator to an input signal, and a tranducer responsive to the output of the adder to generate the input to the delay line, means for stabilizing the gain round the loop close to unity, and adjustable control means which can be set to determine a selected number N of circulations round the loop and a corresponding processing time NT, and a subsequent measurement time of duration T.

5. A spectrum analyser according to claim 4, wherein the control means comprise a presettable counter arrangement which counts cycles of the phase advance signal to determine the number N and processing time NT.

* * * * *